United States Patent [19]
Slutz

[11] Patent Number: 6,005,405
[45] Date of Patent: Dec. 21, 1999

[54] PROBE PLATE ASSEMBLY FOR HIGH-NODE-COUNT CIRCUIT BOARD TEST FIXTURES

[75] Inventor: Robert A. Slutz, Loveland, Colo.

[73] Assignee: Hewlett Packard Company, Palo Alto, Calif.

[21] Appl. No.: 08/884,689

[22] Filed: Jun. 30, 1997

[51] Int. Cl.⁶ .................................................. G01R 31/02
[52] U.S. Cl. .......................................... 324/761; 324/754
[58] Field of Search ..................................... 324/754, 757, 324/758, 761, 158.1

[56] References Cited

U.S. PATENT DOCUMENTS

| | | | |
|---|---|---|---|
| 4,771,234 | 9/1988 | Cook et al. | 324/758 |
| 4,799,007 | 1/1989 | Cook et al. | 324/758 |
| 4,870,354 | 9/1989 | Davaut | 324/761 |
| 4,977,370 | 12/1990 | Andrews | 324/761 |
| 5,218,292 | 6/1993 | Goto | 324/761 |
| 5,399,982 | 3/1995 | Driller et al. | 324/754 |
| 5,646,522 | 7/1997 | Etemadpour et al. | 324/754 |
| 5,773,988 | 6/1998 | Sayre et al. | 324/761 |
| 5,818,248 | 10/1998 | St. Onge | 324/761 |

*Primary Examiner*—Glenn W. Brown
*Attorney, Agent, or Firm*—Kevin M. Hart

[57] ABSTRACT

A probe plate assembly for use in a circuit board test fixture is disclosed. First and second plates are mounted substantially parallel to one another and with a space between them. Probe pins are mounted to the first plate and oriented so that they can contact a device under test on the side of the first plate opposite the space. Electrical contacts are mounted to the second plate and oriented so that they can contact a test head on the side of the second plate opposite the space. Flexible conductors electrically couple the probe pins to the electrical contacts. In a disclosed embodiment, the probe pins are spring probes, and the second plate contains clearance holes disposed adjacent the spring probes. Each of the clearance holes has sufficient diameter to allow the socket tail of one of the spring probes to pass through it without substantial friction. The result is that forces from the test head are mechanically decoupled from the first plate, thus preventing bowing of the first plate. In a further disclosed embodiment, a spacer is disposed between and near the periphery of the first and second plates. The spacer may be one continuous gasket piece forming a vacuum seal around the perimeters of the first and second plates. The spacer, as well as the first and second plates, may be made of fiberglass. The first plate may be thinner or less rigid than the second plate and may alternatively be made, for example, of transparent plexiglass.

12 Claims, 4 Drawing Sheets

PROBE PLATE ASSEMBLY FOR HIGH-NODE-COUNT CIRCUIT BOARD TEST FIXTURES

FIELD OF THE INVENTION

This invention relates generally to circuit board test fixtures, and more particularly to probe plate assemblies used in high-node-count circuit board test fixtures.

BACKGROUND

FIG. 1 is an exploded cross-sectional view of a prior art circuit board test fixture 100. Test fixture 100 includes test head 102, probe plate assembly 104 and protective plate 106.

Test head 102 is equipped with numerous test head pins 110 that are mounted to test head platform 112. For ease of illustration, the number of test head pins shown in the drawing is intentionally low. An actual test fixture would more commonly contain one or two thousand test head pins, and a high-node-count test fixture may contain perhaps three thousand or more test head pins. Each of test head pins 110 is a spring-loaded probe-and-socket assembly well known in the industry. Typically, the spring probes selected for each of test head pins 110 might be capable of exerting a force of perhaps four ounces. Test head pins 110 are electrically coupled to test head control system 114. Test head control system 114 provides generic test resources such as power, ground and programmable signal sources sufficient to verify the functionality of a wide variety of circuit board types.

Probe plate assembly 104 includes probe plate 116, frame 118 and alignment plate 120. Frame 118 is typically made of aluminum, steel or other metal. Probe plate 116 is typically made of type G10 fiberglass. Alignment plate 120 is typically made of plastic. Numerous probe pins 122 are mounted to probe plate 116. Probe pins 122 are also conventional spring-loaded probe-and-socket assemblies. However, the spring force selected for probe pins 122 usually would be somewhat higher than the spring force selected for test head pins 110. For example, the spring probes selected for each of probe pins 122 might be capable of exerting perhaps eight ounces of force. Numerous personality pins 124 are also mounted to probe plate 116. Personality pins 124 are not spring loaded, but have a mounting member and a conducting member. The mounting member is typically installed in probe plate 116 using an interference fit. The conducting member extends from the mounting member and is operable to make contact with a test head pin 110. Although the conducting member is substantially rigid along its own axis, it is capable of moving radially to some degree away from the axis of the mounting member. This movement enables personality pins 124 to pass through holes in alignment plate 120 that are not perfectly collinear with the axis of the personality pin mounting member. Further background relating to personality pins 124 may be found in U.S. Pat. No. 4,799,007, titled "Bendable Pin Board Test Fixture," invented by Stephen J. Cook and Michael L. Bullock, assigned to Hewlett-Packard Company and hereby incorporated by reference in its entirety. The mounting location of personality pins 124 on probe plate 116 is dictated by the arrangement of the various test resources that are permanently connected to test head pins 110. The mounting location of probe pins 122, on the other hand, is dictated by the arrangement of test nodes 128 on device-under-test ("DUT") 108. Probe pins 122 are electrically coupled to personality pins 124 typically by wire wrap or solder connections 126. Numerous alignment rods 130 (typically tooling pins) are also mounted to probe plate 116. Alignment rods 130 provide guidance for the proper installation of protective plate 106 and DUT 108 onto test fixture 100.

Vacuum source 132 is coupled to test fixture 100 via valve 134. Channels 136, 138 and 140 are provided within test head platform 112, frame 118 and probe plate 116, respectively, in order to communicate the vacuum to the underside of protective plate 106. Oversized probe pin holes 142 in protective plate 106 communicate the vacuum to the underside of DUT 108, causing it to be pulled firmly down onto test fixture 100 when the vacuum is applied. The result is that probe pins 122 engage test nodes 128. Gasket material 144 is provided on both sides of protective plate 106 to complete the vacuum seal. Vacuum is only one method commonly used to engage DUT 108 with probe pins 122. Other known methods include the application of force from the top side of DUT 108 using pneumatic, hydraulic or motor-driven devices. Once DUT 108 has engaged probe pins 122, test head control system 114 can automatically exercise DUT 108 as necessary to verify its functionality.

Further background relating to prior art circuit board test fixtures may be found in U.S. Pat. No. 4,771,234, titled "Vacuum Actuated Test Fixture," invented by Stephen J. Cook and Kris J. Kanack, assigned to Hewlett-Packard Company and hereby incorporated by reference in its entirety.

Test fixtures like test fixture 100 work well when the number of test head pins 110 is low to moderate—for example, less than 3,000 nodes. In systems having a high node count, however, problems arise because of the aggregate force exerted by test head pins 110 on probe plate 116 via personality pins 124. Consider the case of a test head having a node count of 5,000 nodes: If each test head pin exerts a force of four ounces, the aggregate force applied to probe plate 116 by personality pins 124 will equal 1,250 pounds. FIG. 2 illustrates the problems caused by such large forces. While probe plate 116 may be able to withstand the force without breaking, probe plate 116 nevertheless begins to bow up towards protective plate 106 and DUT 108. This bowing causes some of the probe pins, such as probe pin 122A, to be closer to DUT 108 than other probe pins, such as probe pins 122B and 122C. In addition, the bowing of probe plate 116 causes the probe pins and alignment rods to fan out radially. These effects cause numerous problems. First, it can become difficult to mount DUT 108 onto test fixture 100 because the ends of alignment rods 130 are displaced from their original positions. If DUT 108 can be mounted onto the alignment rods, then it may yet be difficult to unmount DUT 108 because the alignment rods may bind against the sides of the alignment rod holes within DUT 108. Second, the bowing of probe plate 116 and the consequent raising of the center-most probe pins makes it difficult to maintain the vacuum seal of the test fixture. Third, in extreme cases of bowing such as that shown in FIG. 2, the probe pins may miss their intended targets as indicated at 146, 148 and 150. These problems get worse as the node count increases and as the size of the test fixture increases.

Although attempts have been made to strengthen probe plate 116 by reinforcing it or making it thicker, such attempts have generally led to more expensive and cumbersome embodiments and have not successfully prevented the just-described bowing problem. Moreover, it is sometimes desirable to use a transparent plexiglass material for probe plate 116 so that operators may see into the test fixture. Plexiglass is significantly less strong than opaque fiberglass materials such as type G10 fiberglass. Therefore, with high-node-count test fixtures such as test fixture 100, plexiglass may not be used to form probe plate 116 because it exacerbates the bowing of probe plate 116.

SUMMARY OF THE INVENTION

In an embodiment, the invention is a probe plate assembly for use in a circuit board test fixture. First and second plates are mounted substantially parallel to one another and with a space between them. Probe pins are mounted to the first plate and oriented so that they can contact a device under test on the side of the first plate opposite the space. Electrical contacts are mounted to the second plate and oriented so that they can contact a test head on the side of the second plate opposite the space. Flexible conductors electrically couple the probe pins to the electrical contacts. The inventive arrangement is effective to prevent bowing of the first plate by eliminating or reducing mechanical coupling of forces from the test head to the first plate. In a further embodiment, the probe pins are spring probes, and the second plate contains clearance holes disposed adjacent the spring probes. Each of the clearance holes has sufficient diameter to allow the socket tail of one of the spring probes to pass through it without substantial friction. The flexible conductors may be insulated wires, and may be disposed substantially on the side of the second plate opposite the space, thus facilitating easy creation of necessary interconnections between the probe pins and the electrical contacts. In yet a further embodiment, a spacer is disposed between and near the periphery of the first and second plates. For test fixtures using vacuum to hold the device under test, the spacer may be one continuous gasket piece forming a vacuum seal around the perimeters of the first and second plates. The spacer, as well as the first and second plates, may be made of fiberglass.

It is a feature of the inventive probe plate assembly, however, that the first plate may be made thinner or less rigid than the second plate while still preventing probe plate bowing problems associated with prior art test fixtures. Therefore, in one embodiment of the inventive probe plate assembly, the second plate may be made of an opaque, relatively rigid material while the first plate may be made of a less rigid material such as transparent plexiglass.

DETAILED DESCRIPTION OF THE PREFERRED EMBODIMENTS

Figure 1:
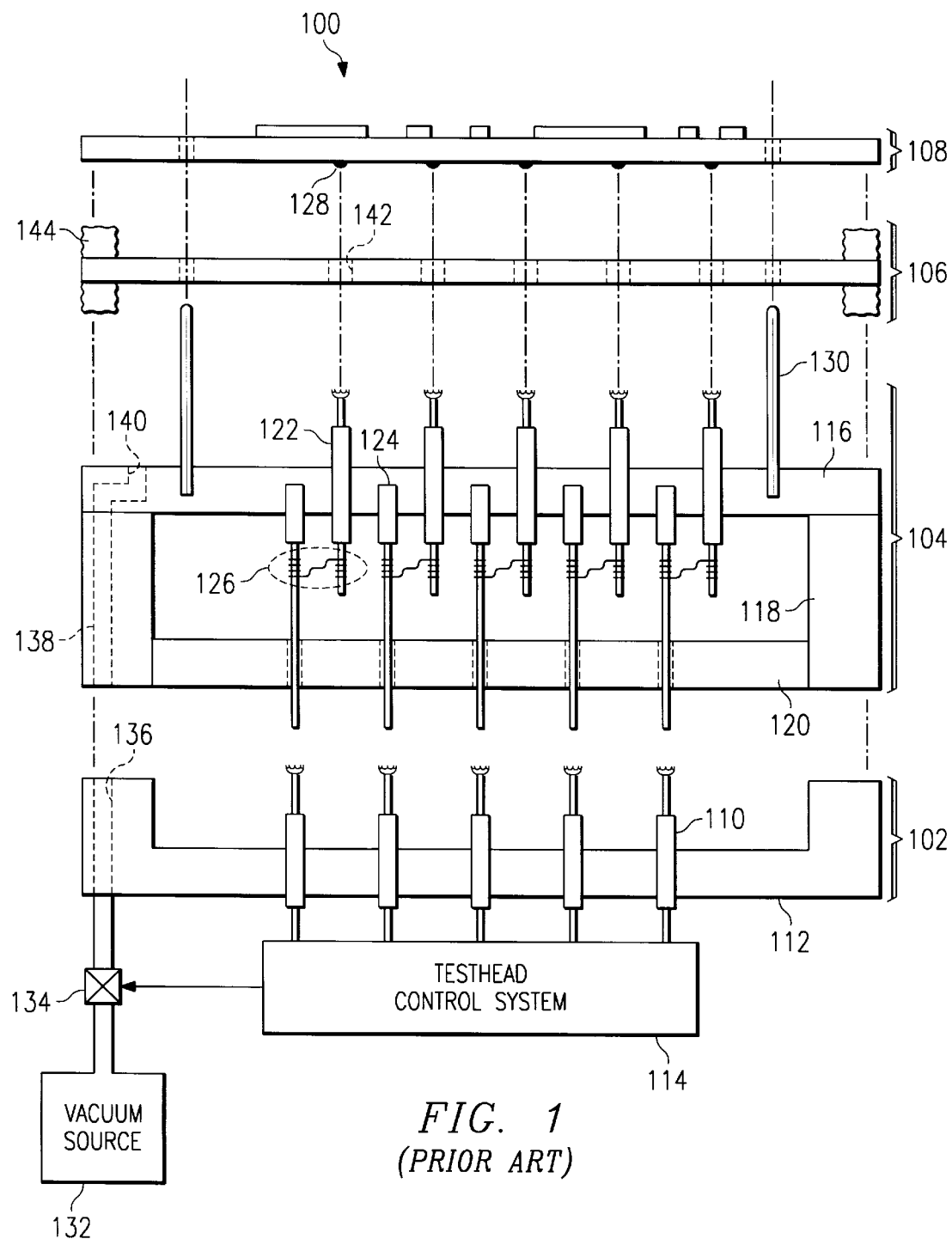
FIG. 1 is an exploded cross-sectional view of a prior art circuit board test fixture.
Figure 2:
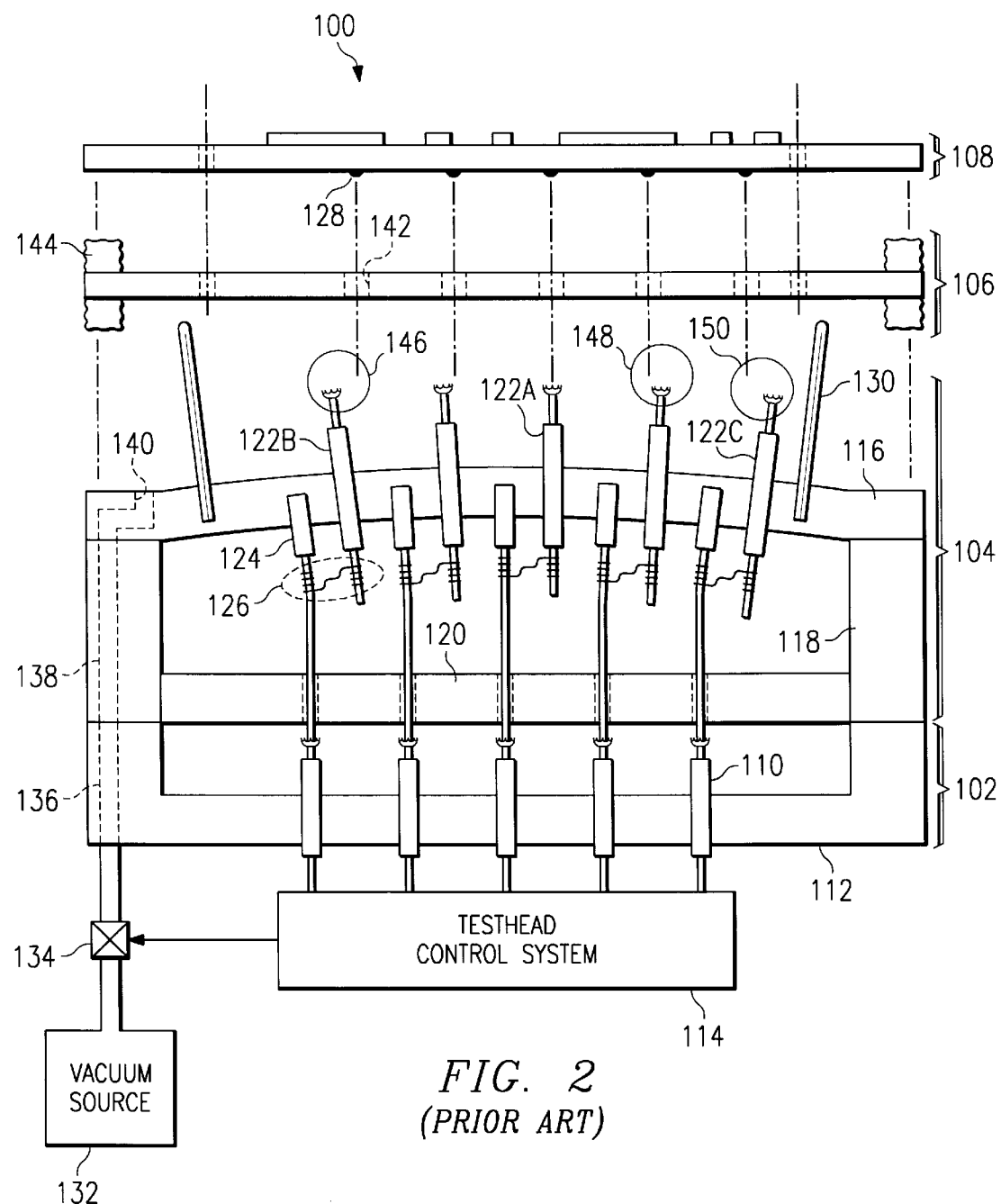
FIG. 2 is an exploded cross-sectional view illustrating problems associated with the prior art circuit board test fixture of FIG. 1.
Figure 3:
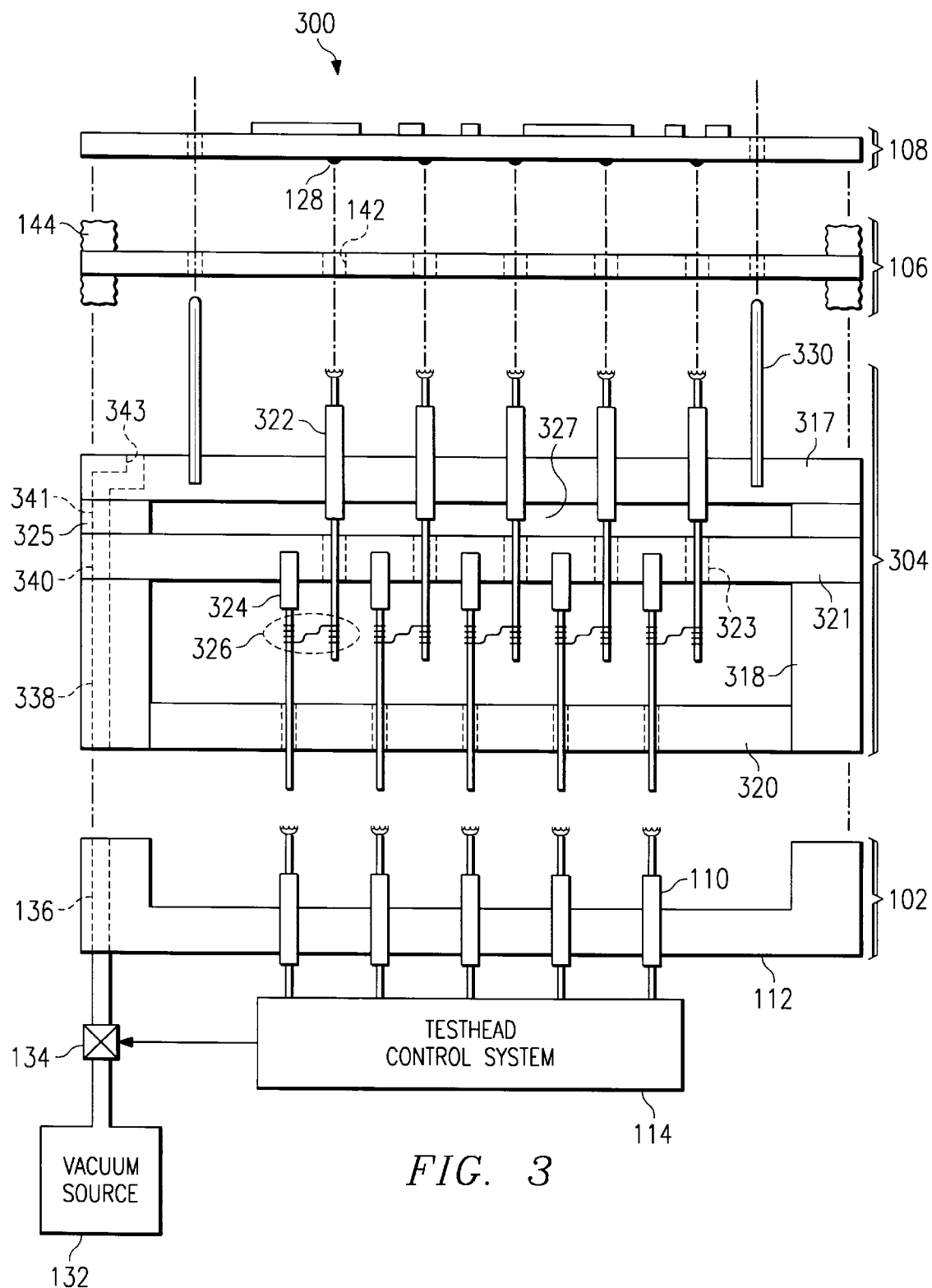
FIG. 3 is an exploded cross-sectional view of a circuit board test fixture according to a preferred embodiment of the invention.

FIG. 3 is an exploded cross-sectional view of a circuit board test fixture 300 according to a preferred embodiment of the invention. Test fixture 300 is similar to test fixture 100 except that probe plate assembly 104 has been replaced with new probe plate assembly 304. Probe plate assembly 304 includes frame 318, alignment plate 320, probe plate 317, intermediate plate 321 and perimeter spacer 325. Probe plate 317, intermediate plate 321 and perimeter spacer 325 may all be made of type G10 fiberglass or other similar material. It is an advantage of the inventive probe plate assembly, however, that probe plate 317 may be made thinner or less rigid than intermediate plate 321. Therefore, in an alternative embodiment, intermediate plate 321 may be made of fiberglass while probe plate 317 may be made of a transparent material such as plexiglass. RTV or a similar adhesive may be used to glue the plates and spacer assembly together. Frame 318 may be made of aluminum, steel or other metal. Alignment plate 320 may be made of plastic. Probe pins 322 are mounted to probe plate 317 and are conventional spring-loaded probe-and-socket assemblies. In a preferred embodiment, long-tailed sockets were used in probe pins 322. Personality pins 324 are mounted to intermediate plate 321. Personality pins 324 are not spring loaded. Probe pins 322 are electrically coupled to personality pins 324 by a flexible conductor such as a wire, as shown at 326. Alignment rods 330 are also mounted to probe plate 317.

Perimeter spacer 325 extends around the perimeter of probe plate 317 and intermediate plate 321, forming a space 327 between the two plates. Preferably, perimeter spacer 325 forms a continuous gasket around the periphery of the plates. In the illustrated embodiment, vacuum from vacuum source 132 is communicated to the underside of protective plate 106 and DUT 108 via channels 338, 340, 341 and 343. In alternate embodiments, channel 340 may be shaped like channel 343, and vacuum holes drilled through intermediate plate 321 and probe plate 317. In the latter embodiments, channels 341 and 343 would be unnecessary, provided the gasket formed by perimeter spacer 325 makes an effective vacuum seal. In yet other embodiments in which methods other than vacuum are used to engage DUT 108 with probe pins 322, the vacuum channels may be deleted altogether. In such embodiments, perimeter spacer 325 need not be one continuous piece, but might be formed by several individual pieces located around the periphery of intermediate plate 321 and probe plate 317. Preferably, however, no spacers or standoffs should be used in the central area of the plates. In a preferred embodiment, probe plate 317 was selected to be approximately 0.375 inches thick, intermediate plate 321 was selected to be approximately 0.563 inches thick, and perimeter spacer 325 was selected to be approximately 0.050 inches thick. Clearance holes 323 were drilled through intermediate plate 321 with sufficient diameter to allow the socket tails of probe pins 322 to pass through intermediate plate 321 without friction.

Figure 4:
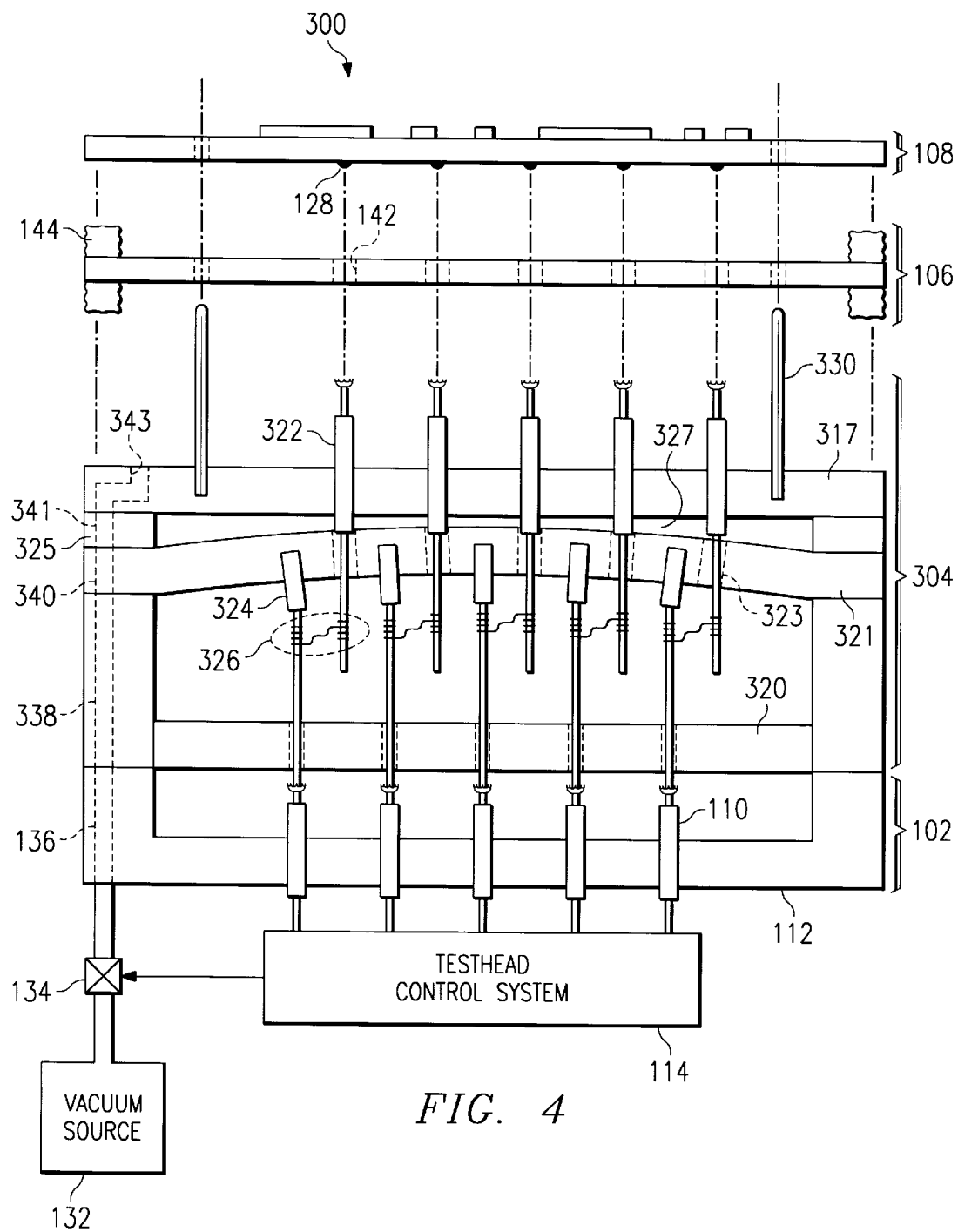
FIG. 4 is an exploded cross-sectional view illustrating how the circuit board test fixture of FIG. 3 solves the problems associated with the prior art circuit board test fixture of FIG. 1.

FIG. 4 is an exploded cross-sectional view illustrating how test fixture 300 solves the bowing problems associated with text fixture 100. As probe plate assembly 304 is forced down onto test head 102, the upward force exerted on personality pins 324 by test head pins 110 is absorbed by the bowing of intermediate plate 321 into space 327. The bowing force is not mechanically coupled to probe pins 322 because clearance holes 323 are large enough to prevent any friction between intermediate plate 321 and the socket tails of probe pins 322. In addition, the electrical coupling 326 between personality pins 324 and probe pins 322 is accomplished by means of flexible conductors (e.g., wires). Therefore, no mechanical coupling occurs between personality pins 324 and probe pins 322 either. The result is that probe pins 322 and alignment pins 330 remain in their original position even after probe plate assembly is mounted onto test head 102. Thus, probe pins 322 and alignment pins 330 no longer miss their targets in protective plate 106 and DUT 108. In addition, probe plate 317 remains flat, and therefore probe pins 322 all remain the same distance from DUT 108. In practice, perimeter spacer 325, intermediate plate 321 and probe plate 317 may all be made individually thinner or thicker than in the illustrated and described embodiment. It has been found that, even if intermediate plate 321 contacts probe plate 317 at the peak of bowing, alignment problems for probe pins 322 will still have been attenuated- because of the force absorbed by intermediate plate 321 before the contact occurs.

While the invention has been described in detail in relation to a particular embodiment thereof, this description is intended to be illustrative only. It will be obvious to those skilled in the art that many modifications can be made to the described embodiment without departing from the spirit and scope of the invention, and that such modifications will remain within the scope of the following claims.

What is claimed is:

1. A probe plate assembly for use in a circuit board test fixture, comprising:

first and second plates mounted substantially parallel to one another and defining a space between them;

a plurality of probe pins mounted to said first plate and operable to contact a device under test on the side of said first plate opposite said space;

a plurality of electrical contacts mounted to said second plate and operable to contact a test head on the side of said second plate opposite said space;

a plurality of flexible conductors electrically coupling said plurality of probe pins to said plurality of electrical contacts: and a plurality of clearance holes in said second plate disposed adjacent said probe pins, each of said clearance holes having sufficient diameter to allow the socket tail of one of said probe pins to pass through it without substantial friction.

2. The probe plate assembly of claim 1, wherein:
   said plurality of probe pins comprises spring probes.

3. The probe plate assembly of claim 1, wherein said plurality of flexible conductors comprises insulated wires.

4. The probe plate assembly of claim 1, wherein said plurality of flexible conductors is disposed substantially on the side of said second plate opposite said space.

5. The probe plate assembly of claim 1, further comprising a spacer disposed between and near the periphery of said first and second plates.

6. The probe plate assembly of claim 5, wherein said spacer comprises one continuous gasket piece forming a vacuum seal around the perimeters of said first and second plates.

7. The probe plate assembly of claim 1, where said first and second plates comprise fiberglass.

8. The probe plate assembly of claim 1, wherein said first plate is less rigid than said second plate.

9. The probe plate assembly of claim 8, wherein said first plate comprises a substantially transparent material.

10. The probe plate assembly of claim 9, wherein said first plate comprises plexiglass.

11. The probe plate assembly of claim 10, wherein said second plate comprises fiberglass.

12. The probe plate assembly of claim 1, wherein said first plate is thinner than said second plate.

* * * * *